United States Patent

Vifian

[11] 4,024,460
[45] May 17, 1977

[54] ELECTRONIC LINE STRETCHER

[75] Inventor: Hugo Vifian, Santa Rosa, Calif.

[73] Assignee: Hewlett-Packard Company, Palo Alto, Calif.

[22] Filed: July 7, 1975

[21] Appl. No.: 593,610

Related U.S. Application Data

[63] Continuation of Ser. No. 418,324, Nov. 23, 1973, abandoned.

[52] U.S. Cl. .............................. 328/155; 307/232; 328/134; 331/25; 331/30
[51] Int. Cl.² ..................... H03K 5/20; H03B 3/06; H03K 9/06
[58] Field of Search ........... 307/232, 233; 328/133, 328/134, 155; 331/21, 17, 25, 30

[56] References Cited

UNITED STATES PATENTS

| | | | |
|---|---|---|---|
| 3,267,357 | 8/1966 | Ravenhill et al. | 331/22 X |
| 3,277,390 | 10/1966 | McLin | 331/30 X |
| 3,393,380 | 7/1968 | Vaughan et al. | 331/25 X |
| 3,475,626 | 10/1969 | Holzman et al. | 328/155 X |
| 3,577,088 | 5/1971 | Goggins, Jr. | 328/155 X |
| 3,621,405 | 11/1971 | Carlsen | 328/155 X |
| 3,775,695 | 11/1973 | Hill | 331/25 X |
| 3,777,276 | 12/1973 | Klein | 331/22 X |
| 3,852,681 | 12/1974 | Underhill | 331/17 X |

FOREIGN PATENTS OR APPLICATIONS

1,433,930 2/1966 France .................. 331/22

OTHER PUBLICATIONS

Noble et al., "Electrical Phase Shift Multiplier"; The Review of Technical Instruments; vol. 36, No. 7, pp. 971–973; July 1965.

*Primary Examiner*—John S. Heyman
*Assistant Examiner*—Larry N. Anagnos
*Attorney, Agent, or Firm*—Patrick J. Barrett

[57] ABSTRACT

A network analyzer is provided with an electronically variable phase shifter in the IF portion of the reference channel, and the phase shifter is connected to sweeping signal generator (sweeper) driving the device under test. As the output frequency of the sweeper changes, the control signal to the phase shifter changes the phase shift in the IF portion of the reference channel, compensating for phase differences between the test and reference signals due to different line lengths in the two signal paths. The electronically variable phase shifter may comprise a linear phase shifter such as a phase lock loop along with a frequency multiplier and down converter to multiply the phase shift produced by the phase shifter.

3 Claims, 4 Drawing Figures

ELECTRONIC LINE STRETCHER

CROSS REFERENCE TO RELATED APPLICATION

This is a continuation of application Ser. No. 418,324, filed Nov. 23, 1973, now abandoned.

BACKGROUND AND SUMMARY OF THE INVENTION

In prior art network analyzers and other two-channel a.c. test instruments, mechanical line stretchers have been used in the reference signal path to eliminate phase differences between the two channels due to different length signal paths. Since mechanical line stretchers require movable contacts which allow line length to change but maintain the same characteristic impedance, they are expensive to build and the various mechanical components wear with use. In addition, such mechanical line stretchers are practical only at higher RF and microwave frequencies. The length necessary for a line stretcher at lower frequencies makes a mechanical line stretcher physically impractical and requires such a large amount of additional transmission line that significant signal losses are often involved.

According to the preferred embodiment of the present invention, the mechanical line stretcher in a network analyzer is replaced by an electronically variable phase shifter. The function of the line stretcher is to introduce a phase shift that varies with the frequency of the test signal. The same function can be implemented by a variable phase shifter which is responsive to the frequency of the signal that the signal generator is supplying. For ease to signal processing, most network analyzers convert the test and reference signals to intermediate frequencies before the phase and amplitude of these signals are measured. The frequency of the intermediate signals does not vary but the phase and amplitude of these signals track the test and reference signals, since the local oscillator used to convert the test and reference signals is also derived from the signal generator driving the device under test. Because it is easier to implement a phase shifter at a single frequency, it is convenient to place the electronic line stretcher in the intermediate frequency portion of the reference channel.

A phase shifter can be implemented in a number of ways, but it is desirable to use a phase shifter that produces a very wide range of phase shifts. Furthermore, it is most convenient to use a phase shifter that is linear in its response to a control signal. A phase lock loop will provide phase shifts over a range of ±180° that are linear with respect to an offset voltage added to the error voltage in the control loop. If the signal generator supplying the test signal sweeps over a broad range of frequencies, however, it is usually necessary to have a phase shifter that will supply considerably more than 360° of phase shift, since a signal path length difference that represents only a few degrees of phase shift at a low frequency will represent several hundred degrees of phase shift at a much higher frequency.

Thus, according to the preferred embodiment of the present invention, a phase shift multiplier circuit is provided to multiply the phase shift produced by a phase shifter. Phase shift may be multiplied by multiplying the frequencies of the unshifted and shifted signals and then mixing the multiplied signals to produce a signal of the same frequency as the unshifted signal. When the frequency of a signal is multiplied, the phase shift of that signal with respect to another similarly multiplied signal is also multiplied. When a signal is converted by mixing with another signal, however, phase relationships are preserved because the process is additive. Thus, the multiplication of the two signals multiplies the phase difference between them and the heterodyne frequency conversion preserves that greater phase shift. In this manner, the ±180° phase shift produced by a phase lock loop can be multiplied many times.

DESCRIPTION OF THE PREFERRED EMBODIMENT

Figure 1:
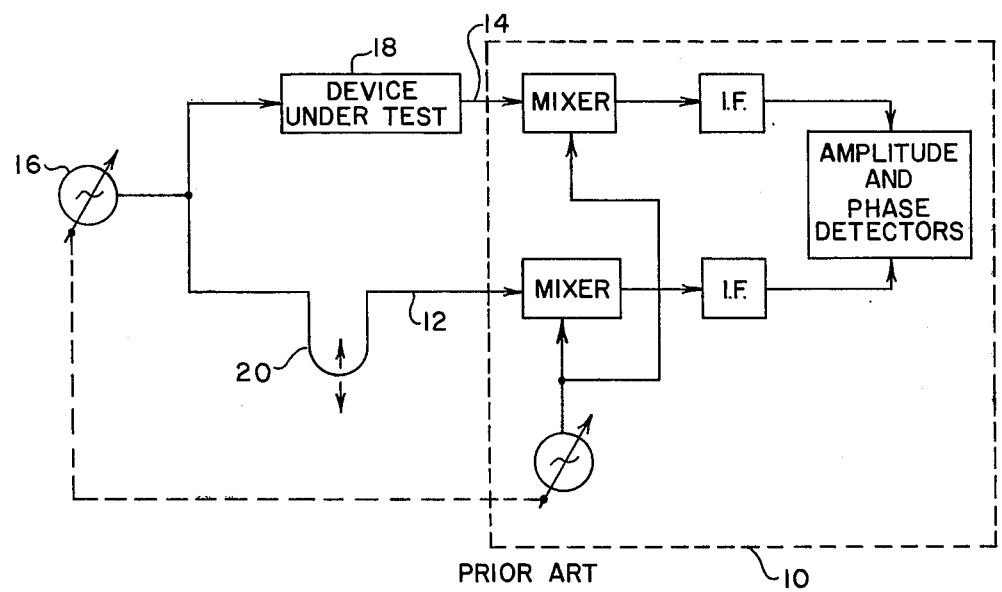
FIG. 1 shows a prior art network analyzer having a mechanical line stretcher.

FIG. 1 shows a known form of network analyzer 10 with a reference channel 12 and a test channel 14. A signal generator 16 supplies a test signal that is swept through a range of frequencies for both the test and the reference channels. A device under test (DUT) 18 is connected between the signal generator and test channel 14 input, and a mechanical line stretcher 20 is connected between the signal generator and the reference channel 12 input. The mechanical line stretcher 20 is adjusted to equalize the signal paths through the two channels between the signal generator and the network analyzer inputs so that any phase differences measured by the network analyzer will be due to variations in the characteristics of DUT 18 rather than line length differences in the two channels.

Figure 2:
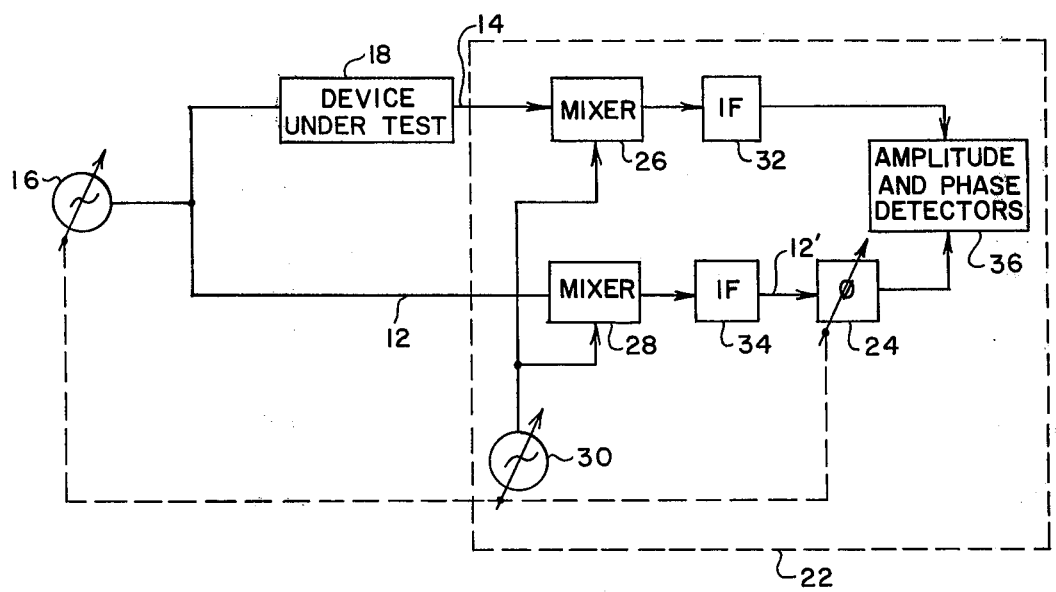
FIG. 2 shows a block diagram of a preferred embodiment of a network analyzer using an electronic line stretcher.

FIG. 2 shows a network analyzer 22 incorporating an electronic line stretcher 24. The network analyzer comprises a test channel mixer 26 and a reference channel mixer 28, both of which are driven by a local oscillator 30. Thus, both of the mixers convert the incoming signals in a phase-coherent manner to a common IF frequency determined by IF filters 32 and 34. Local oscillator 30 is tied to signal generator 16 so that the frequency from local oscillator 30 changes in concert with the sweep of the signal generator to ensure that the network analyzer inputs are always tuned to the output frequency of the signal generator. The offset between local oscillator 30 and signal generator 16 is equal to the IF frequency. The signals on the IF portions of the test and reference channels are fed to the amplitude and phase detectors which measure the relative amplitude and phase of the two signals and display these in an appropriate fashion. Network analyzers operating in the above-mentioned manner, but using mechanical line stretchers, have been commercially available for a number of years; the Hewlett-Packard Models 8410 and 8407 are examples of such network analyzers.

The electronic line stretcher 24 shown in FIG. 2 also acts in concert wth signal generator 16 and local oscillator 30 so that the phase shift introduced by the line stretcher will vary as a linear function of the frequency of signal generator 16. This is precisely the function performed by the mechanical line stretcher 20 which introduces a fixed length of tranmission line creating a phase shift that varies linearly with frequency.

The variable phase shifter used to implement electronic line stretcher 24 can be realized in a number of ways. Variable phase shifters can be built using reactive networks with a variable reactive element. These types of phase shifters are usually limited in range, however, and would not be particularly suitable for a wide range of test frequencies. A wider range phase shifter can be realized using a phase lock loop. While such a phase shifter would be suitable for wider frequency ranges than would a reactive phase shifter, the very wide frequency ranges of currently available signal generators require an even wider range of phase shifts for many applications.

Figure 3:
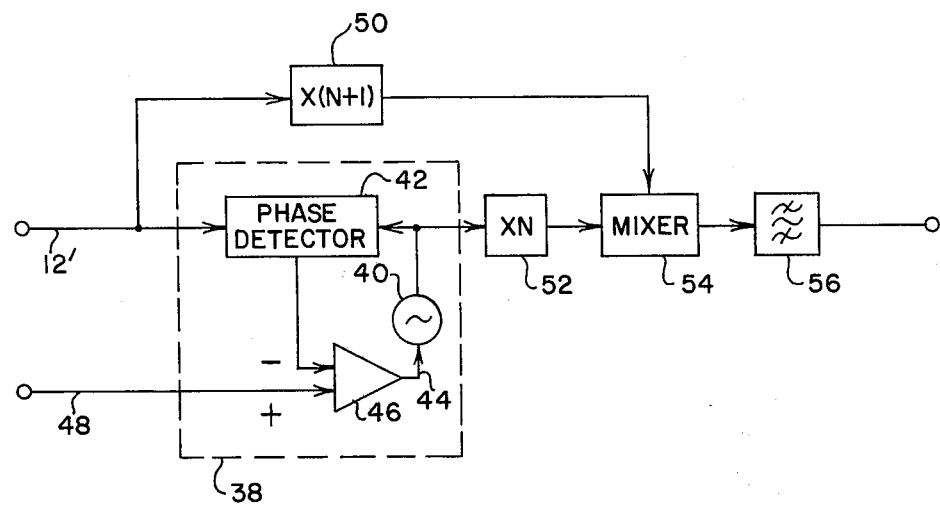
FIG. 3 shows a preferred embodiment of an electronic line stretcher.

FIG. 3 shows one form of electronic line stretcher 24 using a phase shifter 38 with a phase shift multiplier circuit attached to it. The phase shifter 38 comprises a variable frequency oscillator 40 connected to a phase detector 42 which is also connected to the IF portion of the reference channel 12'. The phase detector gives an output signal proportional to the phase difference between the output of oscillator 40 and the converted reference signal on reference channel 12'. This phase detector output signal is applied to a tuning input 44 of oscillator 40 through a feedback amplifier 46. This feedback loop forces the output of oscillator 40 to be at the same frequency as and in phase with the converted reference signal.

The phase between the converted reference signal and the output of oscillator 40 can be varied by adding a voltage to the feedback signal from the phase detector, thus introducing an offset into the error voltage fed into tuning input 44. Phase control line 48 is used to introduce such an offset signal into the feedback amplifier 46. Phase control line 48 receives a signal from signal generator 16 to provide an offset voltage proportional to the frequency of the signal from signal generator 16. Most sweeping signal generators contain an oscillator that is swept in frequency by a time varying sweep signal which is externally available for synchronizing other equipment with the signal generator.

In order to realize phase shifts that are linear with the control signal on phase control line 48, it is desirable to have a linear phase detector 42. Although many known types of phase detectors would be suitable for use in this application, applicant has found that a commonly known phase detector comprising a flip-flop with an integrating capacitor on its output is the most suitable for wider range phase shift applications. The phase between the signals on the flip-flop inputs determines the duty cycle of the flip-flop output signal, and thus the voltage built up on the capacitor by the output of the flip-flop is directly proportional to the phase between the signals applied to the flip-flop inputs.

The phase shift multiplier associated with phase shifter 38 comprises two frequency multipliers 50 and 52 connected respectively to the input and output of phase shifter 38. The outputs of these frequency multipliers are connected to a mixer 54 which is, in turn, connected to a bandpass filter 56. Frequency multiplier 50 multiplies the converted reference signal on reference channel 12' signal by a factor of N + 1, where N may be any real number, though most frequently it will be an integer. Frequency multiplier 52 multiplies the output signal of oscillator 40 by a factor of N. Thus, the phase difference between the converted reference signal and the output of oscillator 40 will be multiplied by a factor of N. The output of mixer 54 will be the sum and difference of the input frequencies and bandpass 56 filters out the sum frequency to allow only the difference frequency to pass through. Thus, the output signal from filter 56 will be the same frequency as the converted reference signal on the IF portion of reference channel 12 but shifted N$\phi$ in phase, where $\phi$ is the phase shift introduced by phase shifter 38.

Frequency multipliers 50 and 52 may be implemented in a number of ways; for example, one may use the common technique at a diode multiplier coupled with a filter to select the appropriate harmonic. The mixer may be any of several well-known types such as a double-balanced diode quad mixer.

Figure 4:
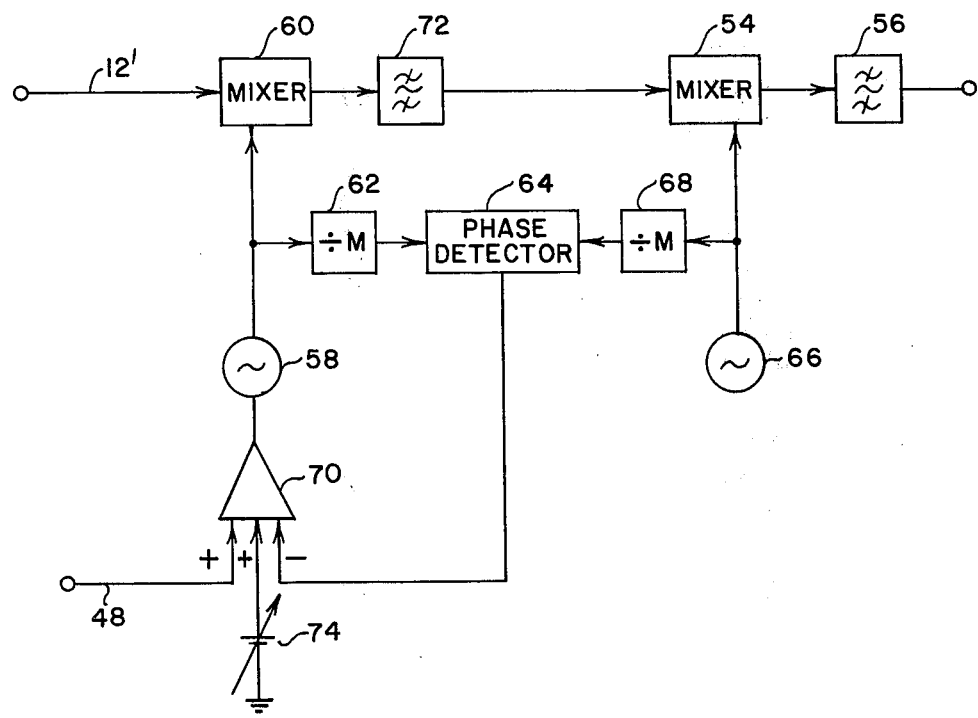
FIG. 4 shows a block diagram of another preferred embodiment of an electronic line stretcher.

FIG. 4 shows another embodiment of electronic line stretcher 24. A variable frequency oscillator 58 is connected to a mixer 60 which mixes the output oscillator 58 with the converted reference signal on reference channel 12'. The output of oscillator 58 is also divided by a frequency divider 62 and the divided signal is fed to a phase detector 64. The divided signal from oscillator 58 is compared with a signal from an oscillator 66 which is also fed through a divider 68. The output of phase detector 54 is fed back to the tuning input of oscillator 58 through a feedback amplifier 70. The phase lock loop around oscillator 58 keeps it at the same frequency as oscillator 66 since frequency dividers 62 and 68 divide by the same factor, M. Feedback amplifier 70 is connected to phase control line 48 so that an offset voltage can be introduced into the frequency control input of oscillator 58 to create a phase shift between oscillators 58 and 66, as described in connection with FIG. 3.

As described above for phase detector 42, phase detector 64 may be implemented using a flip-flop and an integrating capacitor at the output of the flip-flop. Frequency dividers 62 and 68 may be simple flip-flop chains or binary dividers. Mixer 60, like mixer 54, may be a common double-balanced mixer.

The output frequency of oscillator 58 is preferably higher than the frequency of the converted reference signal. For example, if the IF frequency is 100 kilohertz the output signal from oscillator 58 may be 1 megahertz. These two signals, after being added in mixer 60, are passed through the bandpass filter 72 to select one mixing product and feed it to mixer 54. In mixer 54 the output of oscillator 66 is used to convert the signal from mixer 60. This output signal has the same frequency as the IF signal on reference channel 12' because the output signals from oscillators 58 and 66 are the same frequency. The result is that the IF signal is phase shifted by the phase difference between the signals from oscillators 58 and 66.

In this embodiment phase shift is introduced between the signals from oscillators 58 and 66 in the phase lock loop around oscillator 58 in response to a signal applied to line 48 connected to feedback amplifier 70, as described in connection with the phase lock loop in FIG. 3. This phase lock loop can be used to introduce phase shifts of ±180° as a linear function of the signal on line 48. Since it is the divided signals from dividers 62 and 68 that are compared in phase detector 64, the ±180° phase shift is introduced at the divided frequency. Thus, the phase shift multiplication in this embodiment is by a factor of M since oscillators 58 and 66 have an output frequency M times the frequency of the signals fed to phase detectors 64. This embodiment differs from the embodiment of FIG. 3 in that the converted reference signal need not be increased to a frequency that is M times the converted reference frequency. A very high phase shift multiplication can be accomplished without a similar increase in the converted reference signal in mixer 60. It should be noted that in this embodiment the phase shifter also forms a portion of the phase shift multiplier.

A variable voltage source 74 is connected to feedback amplifier 70 so that a fixed offset in the phase of the converted reference signal may be introduced. This adjustment is equivalent to the adjustment of the line length of the mechanical line stretcher.

The variable voltage source 74 may be replaced with a signal from amplitude and phase detector 36 that indicates the phase difference between the test and reference channels. This phase feedback signal will adjust the phase shift introduced into the IF portion of the reference channel to be always the same as the phase shift in the test channel. Thus, when there is no phase shift in the device under test the phase feedback signal will be constant and any variations in this feedback signal will reflect the phase shift through the device under test. This same signal can be used to derive information about group delay and phase delay through the device under test.

I claim:

1. A phase shift circuit for shifting the phase of an input signal comprising;
   input means for receiving the input signal;
   first means for supplying a first signal having a first frequency;
   second means for supplying a second signal having a second frequency;
   first circuit means connected to the first means for supplying a submultiple of the first signal;
   second circuit means connected to the second means for supplying a submultiple of the second signal;
   control means connected to the first means and the first and second circuit means for comparing the relative phase of the submultiples of the first and second signals for making the frequencies of the submultiples of the first and second signals equal and controlling the relative phase thereof;
   third circuit means connected to the input means and the first means for producing a third signal having a frequency equal to the second frequency plus or minus the frequency of the input signal; and
   heterodyne converter means connected to the third circuit means and the second means for producing an output signal equal in frequency to the input signal and shifted in phase with respect to the input signal.

2. A phase shift circuit as in claim 1 wherein:
   the first and second circuit means comprise first and second frequency dividers;
   the first means comprises a first oscillator having an output connected to the first frequency divider and having a control input;
   the second means comprises a second oscillator having an output connected to the second frequency divider;
   the control means comprises a phase detector having a first and a second input connected respectively to the first and the second frequency dividers and having an output, and a control amplifier having an input connected to the phase detector output and having an output connected to the first oscillator control input;
   the third circuit means comprises a first mixer having a first input connected to the input means, having a second input connected to the output of the first oscillator, and having an output; and
   the heterodyne converter means comprises a second mixer having a first input connected to the output of the first mixer, having a second input connected to the output of the second oscillator and having an output, and a filter connected to the output of the second mixer.

3. A phase shift circuit as in claim 2 further comprising an offset signal source connected to the control amplifier for introducing an offset in the relative phase between the submultiples of the first and second signals and thus between the input and output signals.

* * * * *